(12) United States Patent
Conti et al.

(10) Patent No.: US 11,647,638 B2
(45) Date of Patent: May 9, 2023

(54) MEMORY DEVICE WITH DOUBLE PROTECTIVE LINER

(71) Applicant: INTEL CORPORATION, Santa Clara, CA (US)

(72) Inventors: Anna Maria Conti, Milan (IT); Fabio Pellizzer, Boise, ID (US); Agostino Pirovano, Milan (IT); Kolya Yastrebenetsky, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 914 days.

(21) Appl. No.: 16/295,687

(22) Filed: Mar. 7, 2019

(65) Prior Publication Data

US 2020/0286957 A1     Sep. 10, 2020

(51) Int. Cl.
*H01L 23/528* (2006.01)
*H01L 27/24* (2006.01)
*H01L 45/00* (2006.01)

(52) U.S. Cl.
CPC ........ *H01L 27/2481* (2013.01); *H01L 23/528* (2013.01); *H01L 45/1233* (2013.01); *H01L 45/1253* (2013.01); *H01L 45/143* (2013.01); *H01L 45/144* (2013.01); *H01L 45/16* (2013.01)

(58) Field of Classification Search
CPC ............... H01L 23/528; H01L 27/1481; H01L 45/1233; H01L 45/1253; H01L 45/143
See application file for complete search history.

(56) References Cited

U.S. PATENT DOCUMENTS

| 2010/0124800 A1* | 5/2010 | Park ........................ H01L 45/06 |
| | | 438/102 |
| 2010/0163826 A1* | 7/2010 | Peters .................... H01L 45/144 |
| | | 257/E47.001 |
| 2017/0243919 A1* | 8/2017 | Seong ................... H01L 45/144 |
| 2019/0036022 A1 | 1/2019 | Pirovano et al. |

OTHER PUBLICATIONS

Karpov, et. al., "Phase Change Memory with Chalcogenide Selector (PCMS): Characteristic Behaviors, Physical Models and Key Material Properties," Mater. Res. Soc. Symp. Proc. vol. 1250, 2010 Materials Research Society, 10 pages.

* cited by examiner

*Primary Examiner* — Samuel A Gebremariam
(74) *Attorney, Agent, or Firm* — Compass IP Law PC

(57) ABSTRACT

A memory cell design is disclosed. In an embodiment, the memory cell structure includes at least one memory bit layer stacked between top and bottom electrodes. The memory bit layer provides a storage element for a corresponding memory cell. One or more additional conductive layers may be included between the memory bit layer and either, or both, of the top or bottom electrodes to provide a better ohmic contact. In any case, a dielectric liner structure is provided on sidewalls of the memory bit layer. The liner structure includes a dielectric layer, and may also include a second dielectric layer on a first dielectric layer. Either or both first dielectric layer or second dielectric layer comprises a high-k dielectric material. As will be appreciated, the dielectric liner structure effectively protects the memory bit layer from lateral erosion and contamination during the etching of subsequent layers beneath the memory bit layer.

16 Claims, 17 Drawing Sheets

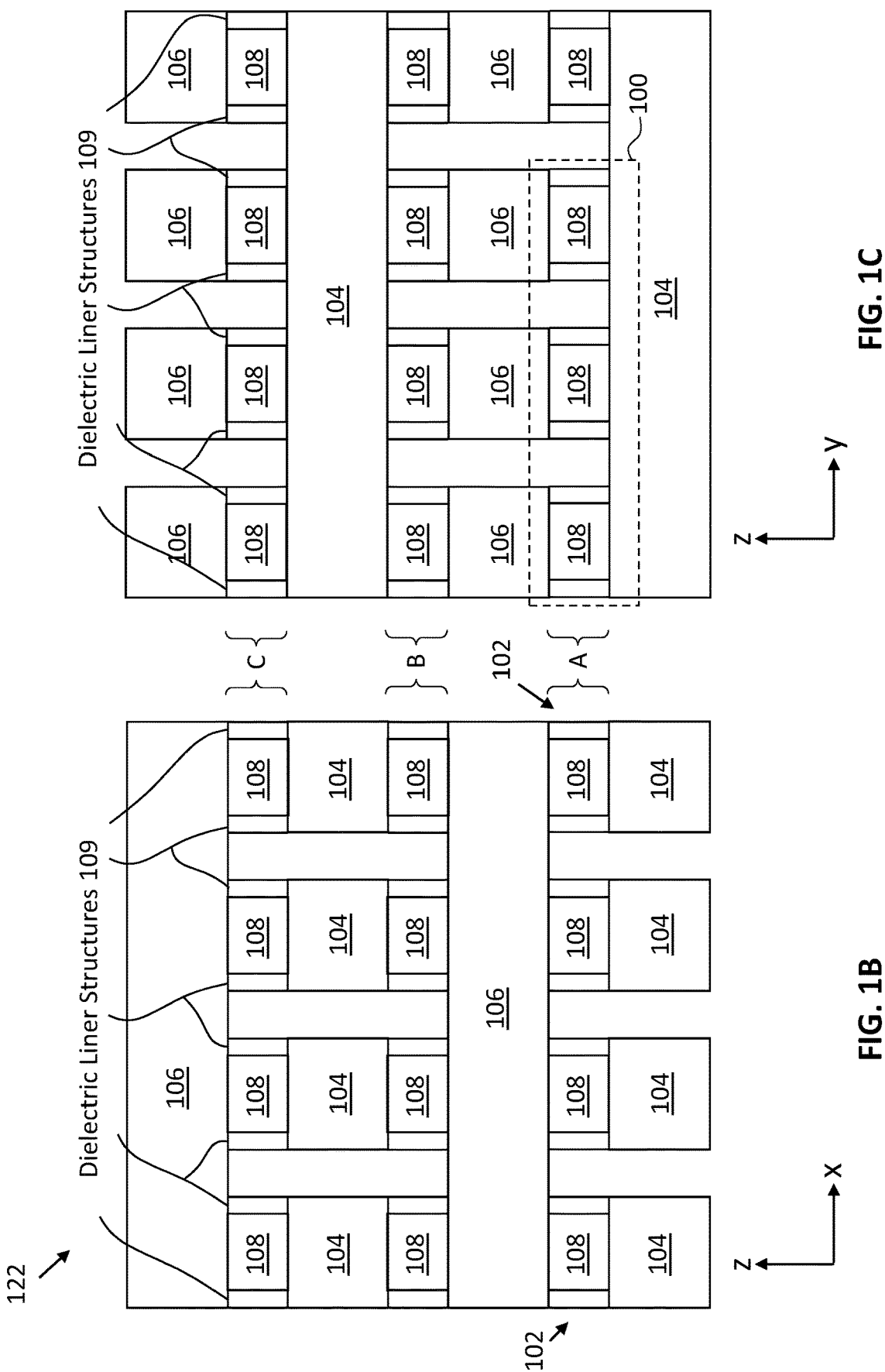

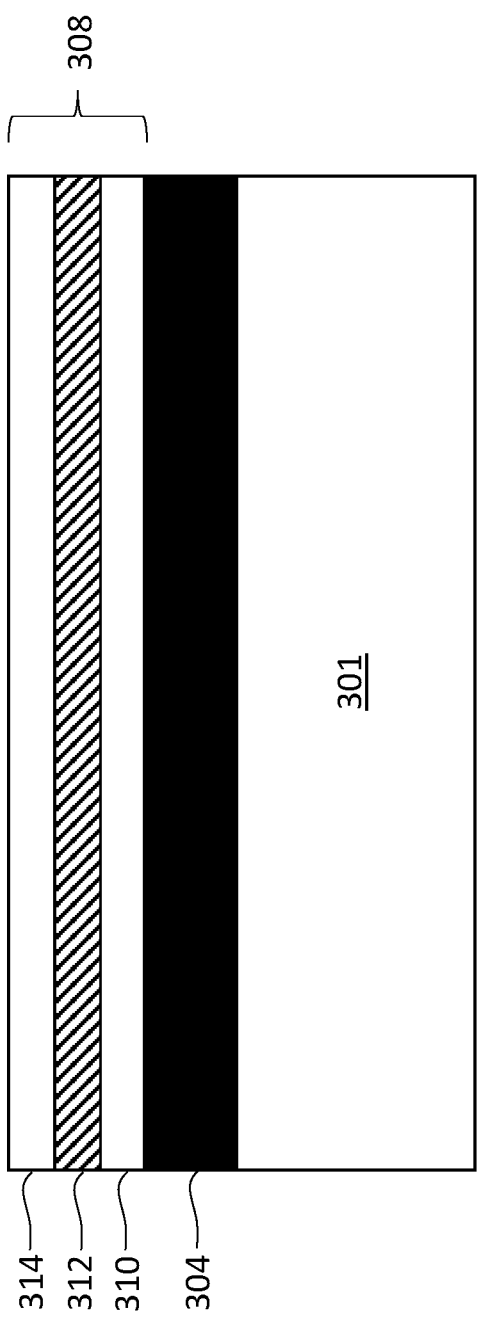

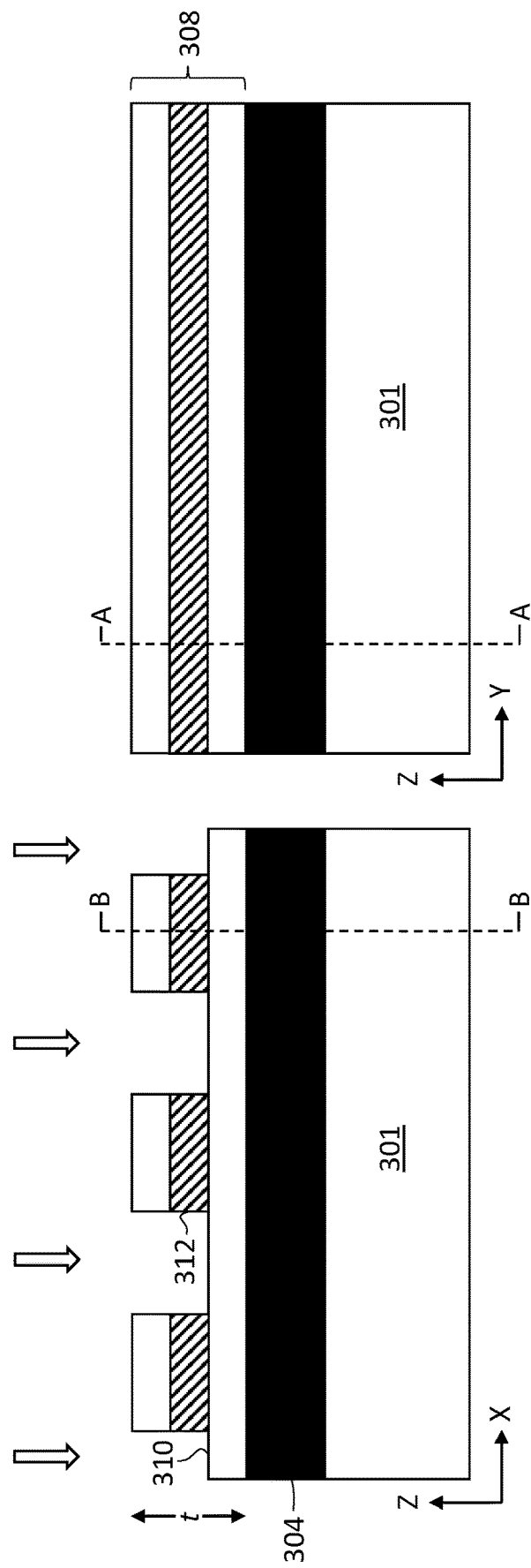

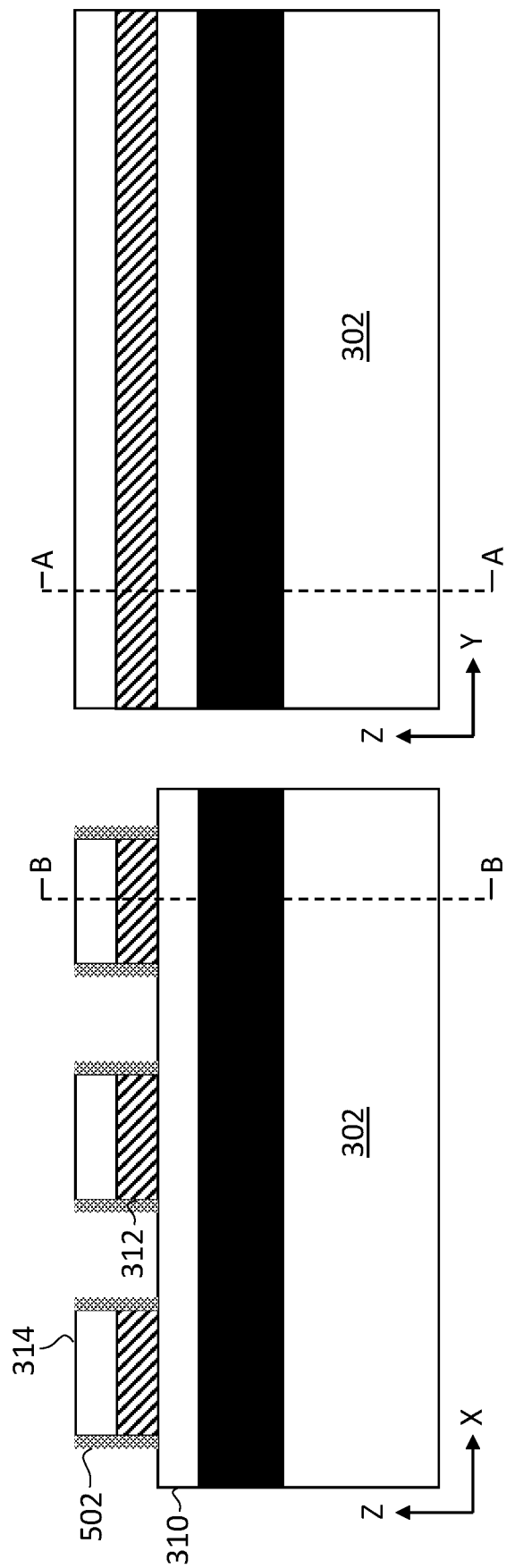

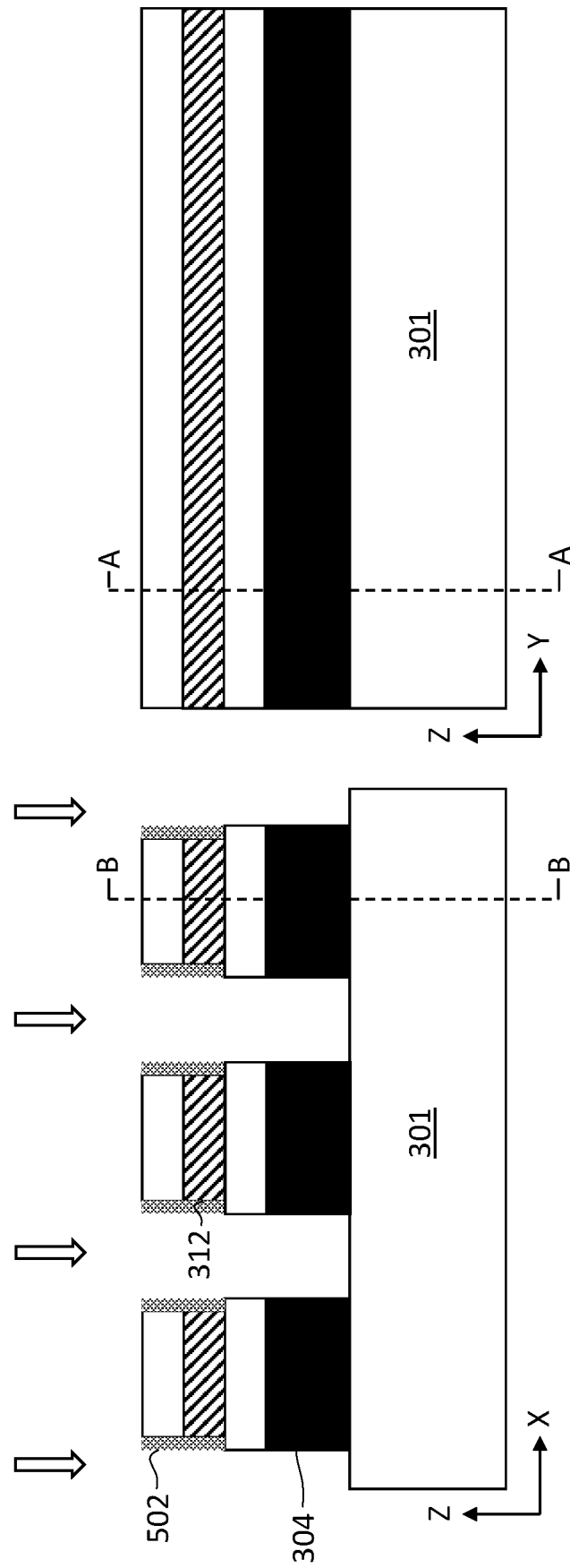

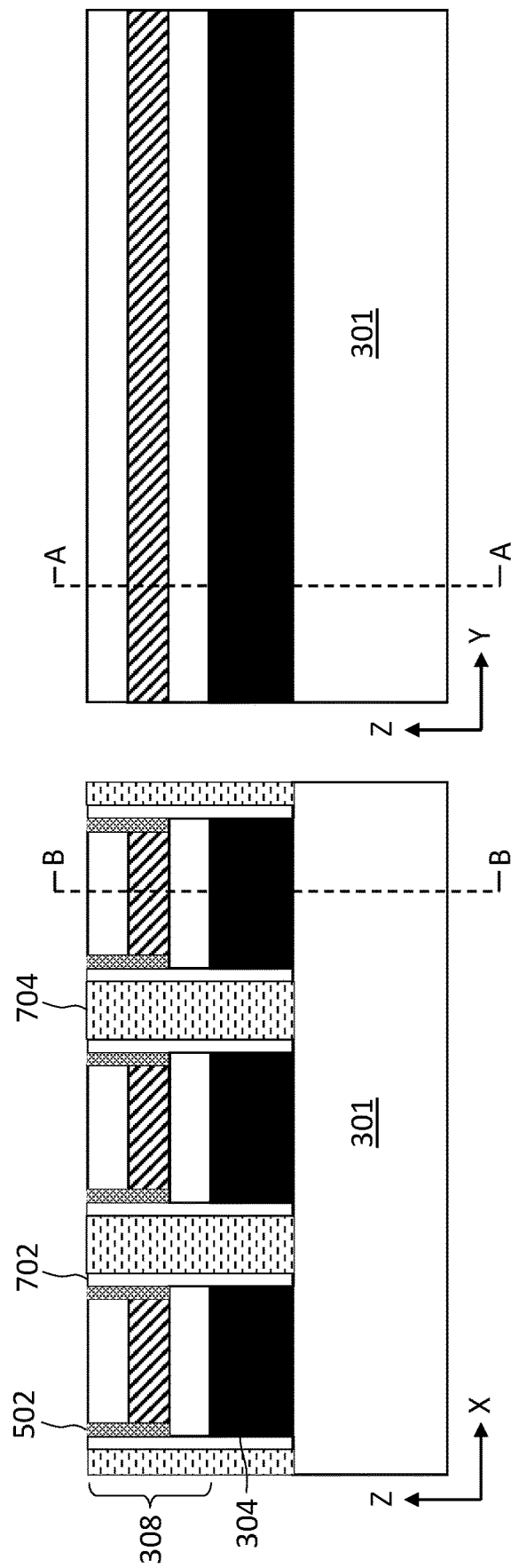

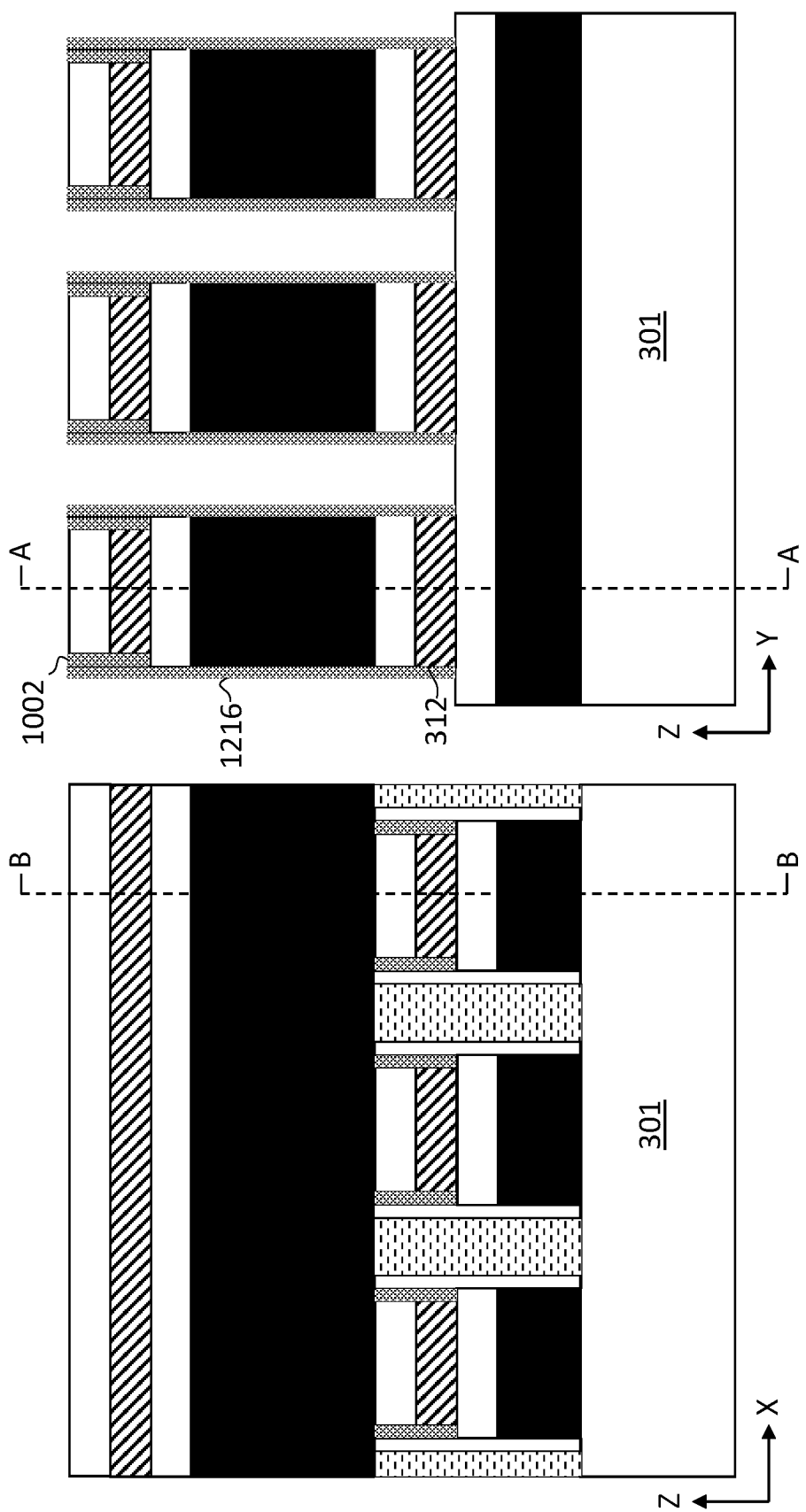

MEMORY DEVICE WITH DOUBLE PROTECTIVE LINER

BACKGROUND

As electronic devices continue to become smaller and more complex, the need to store more data and access that data quickly similarly grows. New memory architectures have been developed that use an array of memory cells with special materials that have variable bulk resistance, allowing the resistance value to dictate whether a given memory cell stores a logic '0' or a logic '1'. Many challenges exist when fabricating such memory architectures.

BRIEF DESCRIPTION OF THE DRAWINGS

Features and advantages of embodiments of the claimed subject matter will become apparent as the following Detailed Description proceeds, and upon reference to the Drawings, in which:

FIGS. 1B and 1C illustrate orthogonal cross-section views of a stacked array of memory cells, in accordance with some embodiments of the present disclosure.

FIG. 3 illustrates a cross-section view of a portion of a memory device during a fabrication procedure of the memory device, in accordance with some embodiments of the present disclosure.

FIGS. 4A and 4B illustrate orthogonal cross-section views of a state of the memory device during the fabrication procedure, in accordance with some embodiments of the present disclosure.

FIGS. 5A and 5B illustrate orthogonal cross-section views of another state of the memory device during the fabrication procedure, in accordance with some embodiments of the present disclosure.

FIGS. 6A and 6B illustrate orthogonal cross-section views of another state of the memory device during the fabrication procedure, in accordance with some embodiments of the present disclosure.

FIGS. 7A and 7B illustrate orthogonal cross-section views of another state of the memory device during the fabrication procedure, in accordance with some embodiments of the present disclosure.

FIGS. 12A and 12B illustrate orthogonal cross-section views of another state of the memory device during the fabrication procedure, in accordance with some embodiments of the present disclosure.

Figure 1A:
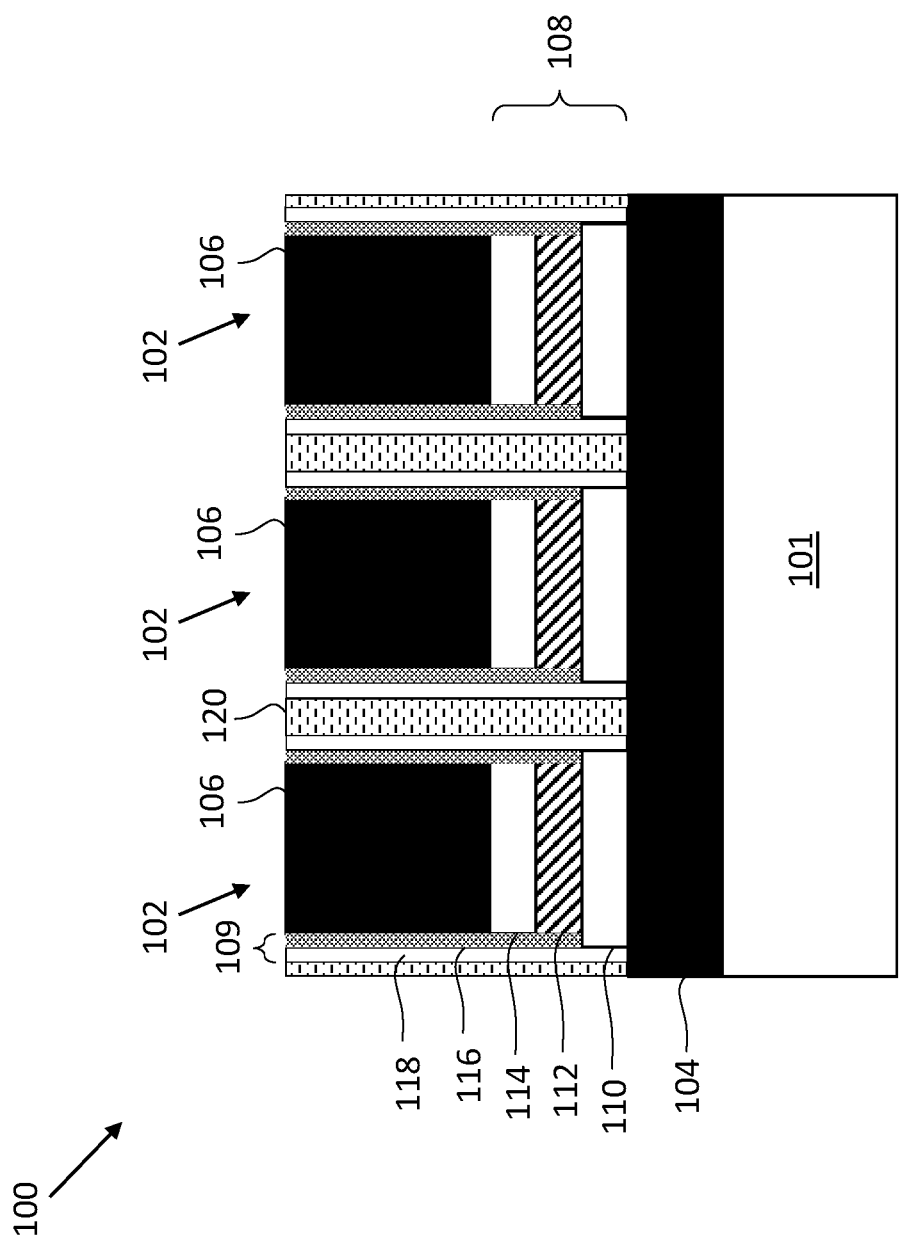
FIG. 1A illustrates a cross-section view of a portion of a stacked array of memory cells, in accordance with some embodiments of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

A memory cell design is disclosed. The design is particularly well-suited for three-dimensional cross-point (3D X-point) memory configurations, although other memory applications can benefit as will be apparent. In an embodiment, the memory cell structure includes at least one memory bit layer stacked between top and bottom electrodes. The memory bit layer provides a storage element for a corresponding memory cell. One or more additional conductive layers may be included between the memory bit layer and either, or both, of the top or bottom electrodes to provide a better ohmic contact. In any case, a dielectric liner structure is provided on sidewalls of the memory bit layer. In an embodiment, the liner structure includes a dielectric layer, while in another embodiment the liner structure includes a second dielectric layer on a first dielectric layer. Either or both the first dielectric layer and/or the second dielectric layer comprises a high-k dielectric material. As will be appreciated in light of this disclosure, the dielectric liner structure effectively protects the memory bit layer from lateral erosion and contamination during the etching of subsequent layers beneath the memory bit layer. Numerous configurations and embodiments will be apparent in light of this disclosure.

General Overview

As noted above, there are several non-trivial issues associated with fabricating memory arrays based on bulk resistance changes of a memory bit material. For example, in some cases, the memory bit material is included as a layer in a multi-layer stack that further includes electrode material layers. This multi-layer stack is then etched into an array of smaller individual stacks. Each individual stack can be used as one memory cell in the overall array. One issue that arises during this etch process is that the etch process exposes various material layers as it continues through the stack, and some materials can contaminate other materials if they are exposed together in the same etching chamber. For example, etching through metal materials while the memory bit material is exposed can cause sidewall damage to the memory bit material. For instance, in some cases, etching through tungsten while leaving portions of the memory bit material exposed causes an undesirable lateral etching of the memory bit material giving it a tapered profile. This tapered profile leads to poorer electrical characteristics and degrades the performance of the memory cell.

Thus, techniques and designs are provided herein to help eliminate or otherwise reduce such issues. In an example embodiment, a fabrication methodology is provided that uses a dielectric liner layer or structure to protect the memory bit layer before performing any further etching through a metal layer. The method includes depositing a first conductive layer over a substrate and depositing a first stack of layers over the first conductive layer. The first stack of layers includes a first memory bit layer. The method includes etching through only a portion of a total thickness of the first stack of layers such that an entire thickness of the first memory bit layer is etched through but subsequent metal layers are not etched (or are otherwise minimally etched), and then depositing a one or more dielectric layers over one or more sidewalls of at least the memory bit layer. The method also includes etching through a remaining portion of the first stack of layers and through a thickness of the conductive layer, after the dielectric liner is in position on the memory bit layer.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 1" may be used to refer to the collection of drawings of FIGS. 1A-1B, and the phrase "FIG. 4" may be used to refer to the collection of drawings of FIGS. 4A-B, etc.

It should be readily understood that the meaning of "above" and "over" in the present disclosure should be interpreted in the broadest manner such that "above" and "over" not only mean "directly on" something but also include the meaning of over something with an intermediate feature or a layer therebetween. Additionally, the meaning of "on" in the present disclosure should be interpreted to mean directly on something (i.e., having no intermediate feature or layer therebetween.)

Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. A substrate can be a layer, can include one or more layers therein, and/or can have one or more layer thereupon, thereabove, and/or therebelow.

Memory Array Architecture

FIG. 1A illustrates a cross-section view of a portion 100 of a memory cell array, according to an embodiment. Portion 100 includes adjacent memory cells 102 each including a stack of material layers 108 sandwiched between a particular word line 104 and bit line 106, according to some embodiments. A potential is applied across a particular word line 104 and a particular bit line 106 in order to read from or program the memory cell 102 at the intersection of (between) the chosen word line 104 and chosen bit line 106. In this manner, word lines 104 and bit lines 106 provide top and bottom electrodes to memory cells 102. As noted in this example, word lines 104 run orthogonal to bit lines 106. Word lines 104 and bit lines 106 may be made of any conductive material, such as a metal, metal alloy, or polysilicon. In some examples, word lines 104 and bit lines 106 are made of tungsten, silver, aluminum, gold, carbon, or copper, or a multi-layer structure comprising such materials (e.g., tungsten and carbon layers).

Each memory cell 102 includes a stack of layers 108 having at least one memory bit layer 112, according to an embodiment. As used herein, the term "memory bit layer" refers to the standard meaning of that phrase in the context of memory devices, and in some cases refers to one or more layers that includes a metalloid alloy. The metalloids include, for example, boron (B), silicon (Si), germanium (Ge), arsenic (As), antimony (Sb), tellurium (Te), Selenium (Se) and polonium (Po). In some embodiments, memory bit layer 112 includes chalcogenide, which comprises an alloy of germanium, arsenic, antimony, and tellurium, such as GeTe, GeSbTe, GeBiTe (GeTe alloyed with bismuth), GeAsSe, GeSiAsSe, or GeInSbTe (GeSbTe alloyed with indium), to name a few non-limiting examples. Moreover, note the stoichiometry of such chalcogenide compounds may vary from one embodiment to the next, and such compounds represented without stoichiometric coefficients or values are intended to represent all forms of that compound.

Memory bit layer 112 includes a material that changes its threshold voltage based on the polarity of a potential applied to it to either represent a logic '0' or a logic '1' for the given memory cell 102. In some example embodiments, chalcogenide is used as the memory bit material and can change its threshold voltage based on a polarity of an applied potential across the chalcogenide.

Stack of layers 108 can include one or more other conductive layers. For example, stack of layers 108 can include a first conductive layer 110 and a second conductive layer 114 to provide enhanced ohmic contact to memory bit layer 112. In an embodiment, conductive layers 110 and 114 comprise tungsten and/or carbon.

As noted above, sidewalls of at least memory bit layer 112 are protected by a dielectric liner structure 109, which in this example embodiment includes dielectric liner 116. According to some embodiments, dielectric liner 116 comprises a high-k dielectric material. As can be seen, dielectric liner 116 may be on one or more sidewalls of only a portion of the total thickness of stack of layers 108 (e.g., not the entire thickness of stack of layers 108). For instance, in the example embodiment shown, dielectric liner 116 is not present on sidewalls of first conductive layer 110. Dielectric liner 116 effectively protects memory bit layer 112 from lateral erosion and contamination during etching of lower material layers (e.g., such as layer 110). Further example details of dielectric liner 116 and its fabrication process will be discussed with respect to FIGS. 5-14.

Further note that dielectric liner structure 109 may include additional layers. For instance, in the example embodiment shown, an additional dielectric layer 118 is provided over the sidewalls of each of memory cells 102 to act as a barrier between the various material layers of memory cells 102 and oxide fill material 120. In some embodiments, oxide fill material 120 fills the remaining regions between adjacent memory cells 102. Note that the additional dielectric layer 118 may cover a greater portion of the memory cell sidewall. For instance, in the example embodiment shown, dielectric liner 118 is present on sidewalls of first conductive layer 110 in addition to dielectric liner 116. In still other embodiments, an initial dielectric layer is deposited prior to dielectric liner 116, such as a nitride layer to improve adhesion between liner 116 and memory cell materials.

FIGS. 1B and 1C illustrate cross-section views of a memory array 122, according to some embodiments. The cross-section views are taken orthogonally to one another in memory array 122. Memory array 122 includes a plurality of memory cells 102 arranged in arrays A, B, and C stacked in the Z-direction to form a 3D memory structure. The array includes an ordered arrangement of rows and columns of memory cells 102 in the XY plane as illustrated in FIGS. 1B and 1C. Other ordered arrangements are possible as well. Each memory cell 102 generally includes a stack of layers 108 that includes one or more memory bit layers. In addition, sidewalls of a portion of stack of layers 108 are protected by a dielectric liner structure 109, such that at least the one or more memory bit layers of stack of layers 108 are protected.

Memory array 122 further includes a plurality of word lines 104 and bit lines 106 used to address a particular memory cell 102. As noted in this example, word lines 104 run orthogonal to bit lines 106, and memory array 100 alternates between word lines 104 and bit lines 106 in the Z-direction. With reference to FIGS. 1B and 1C, word lines 104 run along the Y-direction (into and out of the page in FIG. 1B), and bit lines 106 run along the X-direction (into and out of the page in FIG. 1C).

It will be appreciated that the number of memory cells 102 illustrated is purely used as an example, and that any number of memory cells 102 can be used in each tier, and that any number of tiers in the Z-direction can be used as well. According to some embodiments, the height in the Z-direction of a given memory cell 102 is between about 30 nm and about 50 nm. According to some embodiments, the width in either the X-direction or the Y-direction of a given memory cell 102 is between about 10 nm and about 20 nm. The width may be the same in both the X-direction and the Y-direction. In some embodiments, the width of a given memory cell is different between the X-direction and the Y-direction. Any number of memory cell geometries can be utilized, as will be appreciated.

Figure 2:
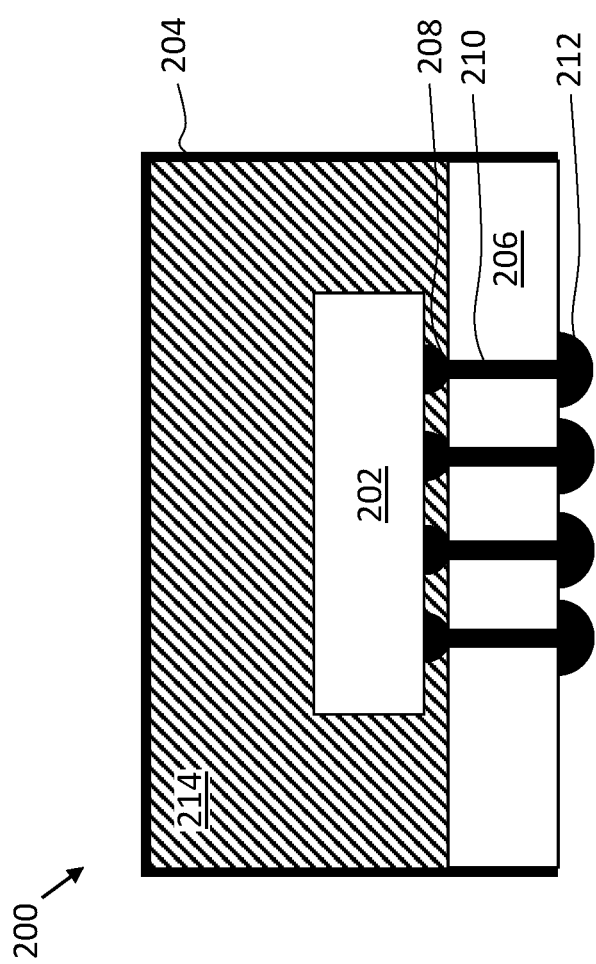
FIG. 2 illustrates a cross-section view of a chip package containing one or more memory dies, in accordance with some embodiments of the present disclosure.

FIG. 2 illustrates an example embodiment of a chip package 200. As can be seen, chip package 200 includes one or more dies 202. Chip package 200 may be a memory device when one or more dies 202 include one or more memory dies, whether it be a dedicated memory die, or some other die that has a memory portion juxtaposed to other functional circuitry of the die (e.g., such as a processor that has on-board memory). Die 202 may include any number of memory arrays 122 as well as any other circuitry used to interface with the memory arrays, in some example configurations. In still other embodiments, memory arrays 122 may be present on one die 202 and other circuitry used to interface (e.g., cell selection circuitry, readout circuitry, and programming circuitry) with die 202 is on another die within chip package 200.

As can be further seen, chip package 200 includes a housing 204 that is bonded to a package substrate 206. The housing 204 may be any standard or proprietary housing, and provides, for example, electromagnetic shielding and environmental protection for the components of chip package 200. The one or more dies 202 may be conductively coupled to a package substrate 206 using connections 208, which may be implemented with any number of standard or proprietary connection mechanisms, such as solder bumps, ball grid array (BGA), pins, or wire bonds, to name a few examples. Package substrate 206 may be any standard or proprietary package substrate, but in some cases includes a dielectric material having conductive pathways (e.g., including conductive vias and lines) extending through the dielectric material between the faces of package substrate 206, or between different locations on each face. In some embodiments, package substrate 206 may have a thickness less than 1 millimeter (e.g., between 0.1 millimeters and 0.5 millimeters), although any number of package geometries can be used. Additional conductive contacts 212 may be disposed at an opposite face of package substrate 206 for conductively contacting, for instance, a printed circuit board. One or more vias 210 extend through a thickness of package substrate 206 to provide conductive pathways between one or more of connections 208 to one or more of contacts 212. Vias 210 are illustrated as single straight columns through package substrate 206 for ease of illustration, although other configurations can be used (e.g., damascene, dual damascene, through-silicon via). In still other embodiments, vias 210 are fabricated by multiple smaller stacked vias, or are staggered at different locations across package substrate 206. In the illustrated embodiment, contacts 212 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 212, to inhibit shorting.

In some embodiments, a mold material 214 may be disposed around the one or more dies 202 included within housing 204 (e.g., between dies 202 and package substrate 206 as an underfill material, as well as between dies 202 and housing 204 as an overfill material). Although the dimensions and qualities of the mold material 214 can vary from one embodiment to the next, in some embodiments, a thickness of mold material 214 is less than 1 millimeter. Example materials that may be used for mold material 214 include epoxy mold materials, as suitable. In some cases, the mold material 214 is thermally conductive, in addition to being electrically insulating.

Fabrication Procedure

FIG. 3 illustrates a cross-section view of an early stage of a fabrication process for a portion of memory array 100, according to an embodiment. The subsequent FIGS. 4-14 illustrate further stages of the fabrication process, with each figure illustrating a cross-section view taken along the X-axis (A) and a cross-section view taken along the Y-axis (B). For example, FIG. 4A illustrates a cross-section view of a portion of memory array 122 taken across the X-axis at the dashed cross-section line A-A shown in FIG. 4B, and FIG. 4B illustrates a cross-section view of the portion of memory array 122 taken across the Y-axis at the dashed cross-section line B-B shown in FIG. 4A. For all figures, the Z-axis is the vertical axis on the page (i.e., along the thickness of each of the deposited layers.) The various layers and structures illustrated in FIGS. 3-14 are not intended to be drawn to scale, but are illustrated in a particular fashion for visual clarity. Further note that some intermediate processes may be performed that are not explicitly illustrated, as will be appreciated (e.g., such as polishing and cleaning processes, or other standard processing). In other embodiments, not all illustrated layers are used and/or additional layers may be included.

As shown in FIG. 3, a first conductive layer 304 is deposited over a substrate 301, followed by the deposition of a stack of layers 308. Substrate 301 may be any suitable substrate material for forming additional material layers over it. In some embodiments, substrate 301 includes a bulk semiconductor material such as silicon, germanium, silicon germanium (SiGe), gallium arsenide, or indium phosphide. Substrate 301 may include one or more insulating layers at its top surface, such as silicon oxide or silicon nitride, or buried below a top semiconductor layer such as in semiconductor-on-insulator substrate configurations.

First conductive layer 304 may be a metal, such as tungsten, silver, aluminum, titanium, cobalt, or an alloy. In some embodiments, first conductive layer 304 has a sufficient thickness (e.g., 1 to 50 nm thick) to propagate signals after first conductive layer 304 has been patterned into word lines or bit lines.

Stack of layers 308 may include one or more conductive layers 310 and 314 with a memory bit layer 312 sandwiched between them, according to some embodiments. Each of conductive layers 310 and 314 may include any conductive material that enhances the ohmic contact being made to memory bit layer 312. In one example, conductive layers 310 and 314 comprise carbon. First stack of layers 308 may include any number of deposited layers with at least one memory bit layer 312. In some embodiments, stack of layers 308 includes two or more layers having memory bit material. The various layers may be deposited using standard deposition techniques, such as chemical vapor deposition (CVD), physical vapor deposition (PVD), and atomic layer deposition (ALD) techniques.

According to some embodiments, first conductive layer 304 has a thickness between about 30 nm and 50 nm, each of conductive layers 310 and 314 has a thickness between about 10 nm and 15 nm, and memory bit layer 312 has a thickness between about 15 nm and 25 nm. All layers may be deposited using any standard deposition techniques, such as metal sputtering or evaporation for first conductive layer 304, and plasma enhanced chemical vapor deposition (PECVD) for conductive layers 310 and 314 and memory bit layer 312.

FIGS. 4A and 4B illustrate a first etching process (generally denoted by the arrows) that etches through a portion of a total thickness t of stack of layers 308, according to some embodiments. The etch forms strips of the material layers including memory bit layer 312 that run along the Y-direction, according to some embodiments. The etching process etches through a thickness of memory bit layer 312, thus exposing the sidewalls of memory bit layer 312. However, the etch does not extend into any portion of first conductive layer 304, according to some embodiments. In one example, the etch stops at conductive layer 310. In some other examples, the etch extends into a portion of a thickness of conductive layer 310. Lateral etching of the material layers is minimized due to the anisotropic nature of the etching process. According to an embodiment, the anisotropic etch is performed using standard dry etching techniques by placing substrate 301 into a vacuum chamber and introducing various gas chemistries and bias potentials to etch through the various material layers. Additionally, standard lithography techniques are performed to pattern a hard mask layer (not shown) to mask portions of the layers from the etch. Example hard mask layers include silicon oxide or silicon nitride.

FIGS. 5A and 5B illustrate the deposition of a first dielectric layer 502 over sidewalls of at least memory bit layer 312, according to some embodiments. Although not explicitly shown for clarity, the deposition of first dielectric layer 502 blankets all regions of the device and an etching process would be performed to remove the planar portions of first dielectric layer 502, thus leaving the sidewall portions of the deposited film. In the illustrated example, dielectric layer 502 is deposited over the sidewalls of memory bit layer 312, the sidewalls of conductive layer 314, and on the top surface of conductive layer 310.

First dielectric layer 502 may include, for example, silicon nitride due to its good adhesion properties to most other materials. In some other examples, first dielectric layer 502 includes a high-k dielectric material, which may be used with a nitride layer or on its own without nitride layer. Examples of high-k materials include oxides of one or more of the following elements: lithium (Li), boron (B), magnesium (Mg), aluminum (Al), silicon (Si), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), strontium (Sr), yttrium (Y), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), samarium (Sm), europium (Eu), gadolinium (Gd), dysprosium (Dy), holmium (Ho), erbium (Er), thulium (Tm), ytterbium (Yb), lutetium (Lu), hafnium (Hf), tantalum (Ta), iridium (Ir), platinum (Pt), lead (Pb), and bismuth (Bi). In some specific example embodiments, first dielectric layer 502 includes hafnium oxide (HfO), zirconium oxide (ZrO), or aluminum oxide (AlO). Other examples of high-k dielectrics include hafnium silicon oxide, lanthanum aluminum oxide, zirconium silicon oxide, barium strontium titanium oxide, barium titanium oxide, strontium titanium oxide, lead scandium tantalum oxide, and lead zinc niobate. In a more general sense, a high-k dielectric is a dielectric material having a dielectric coefficient greater than that of silicon dioxide. First dielectric layer 502 may be deposited, for instance, using a low temperature (e.g., less than 350° C.) atomic layer deposition (ALD) process, according to some embodiments. First dielectric layer 502 may be deposited at a thickness between about 20 Å and about 50 Å, according to some embodiments.

FIGS. 6A and 6B illustrate a second etching process (generally denoted by the arrows) that etches through a remainder of the thickness of stack of layers 308 and through a thickness of first conductive layer 304, according to some embodiments. The second etching process may be similar to the etching process illustrated in FIG. 4, such as an anisotropic dry etch, to provide a desired degree of directionality. Less directional etches (wet and/or dry can be used as well, with the caveat that lateral etching may occur, which may or may not be acceptable in the given application). During the second etching process, exposed sidewalls of memory bit layer 312 are protected by first dielectric layer 502. Specifically, no part of memory bit layer 312 is exposed during the time that first conductive layer 304 is being etched, according to some embodiments. The etching process patterns strips of first conductive layer 304 running in the Y-direction, thus forming a plurality of either word lines or bit lines.

FIGS. 7A and 7B illustrate the deposition of additional material layers between adjacent layer stacks, according to some embodiments. According to some such embodiments, a second dielectric layer 702 is deposited over first dielectric layer 502. Second dielectric layer 702 is also deposited over sidewalls of each layer stack and sidewalls of the etched first conductive layer 304, according to some embodiments. Second dielectric layer 702 may include any of the materials discussed above for first dielectric layer 502 in some embodiments but may be different in other embodiments. For instance, in some embodiments first layer 502 is a nitride and second layer 702 is a high-k dielectric, while in other embodiments first layer 502 is a high-k dielectric and second layer 702 is a regular dielectric (e.g., oxide or nitride or oxynitride). Second dielectric layer 702 may be deposited at a thickness, for example, between about 20 Å and about 50 Å using any standard deposition technique, such as the same low temperature ALD process used to deposit first dielectric layer 502.

A filling material 704 is deposited to fill the remaining area between adjacent layer stacks. In some embodiments, filling material 704 is silicon oxide and is deposited using a PECVD process. After depositing filling material 704, a top surface of the structure may be planarized using a chemical mechanical polishing (CMP) process.

Figure 8B:
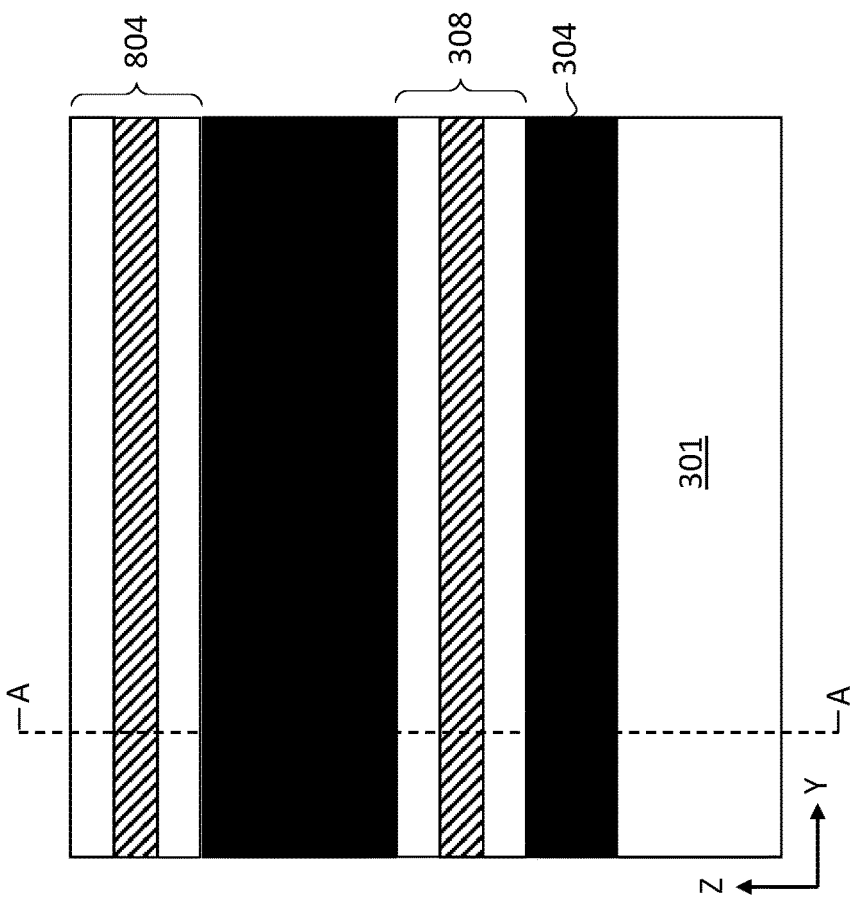
FIGS. 8A and 8B illustrate orthogonal cross-section views of another state of the memory device during the fabrication procedure, in accordance with some embodiments of the present disclosure.
Figure 8A:
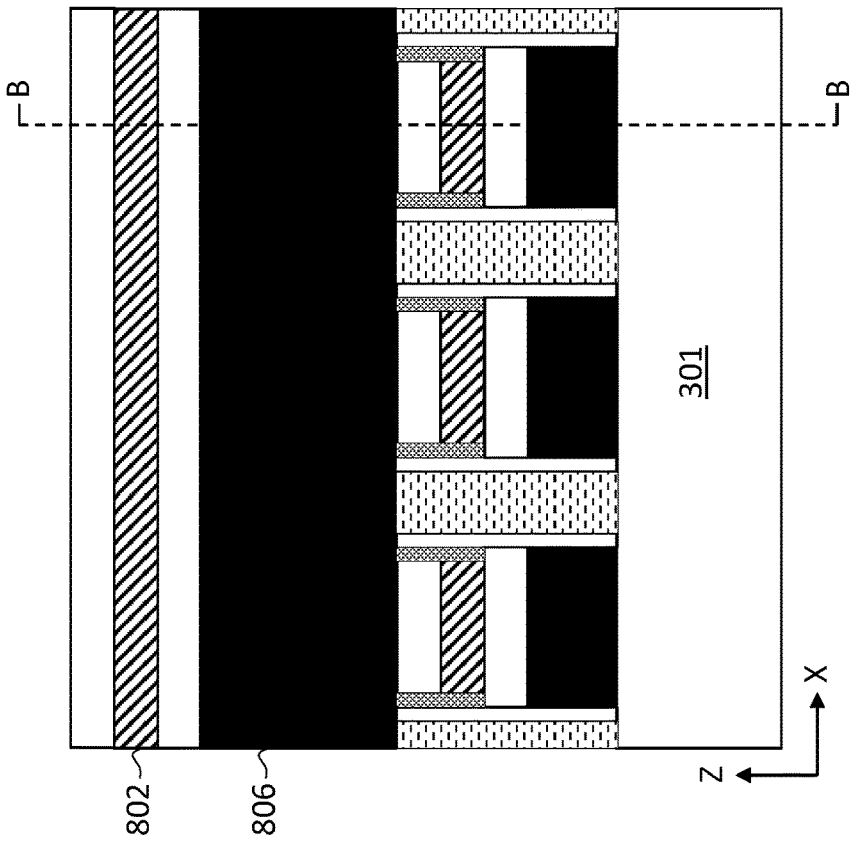

FIGS. 8A and 8B illustrate the deposition of a second conductive layer 806 and another stack of layers 804 that includes at least one memory bit layer 802, according to some embodiments. Stack of layers 804 may have substantially the same structure as stack of layers 308, but in other embodiments may vary in one or more respects, as will be appreciated. Similarly, second conductive layer 806 may be the same material as first conductive layer 304, but need not be the same. In some embodiments, second conductive layer 806 has a greater thickness than first conductive layer 304.

Figure 9B:
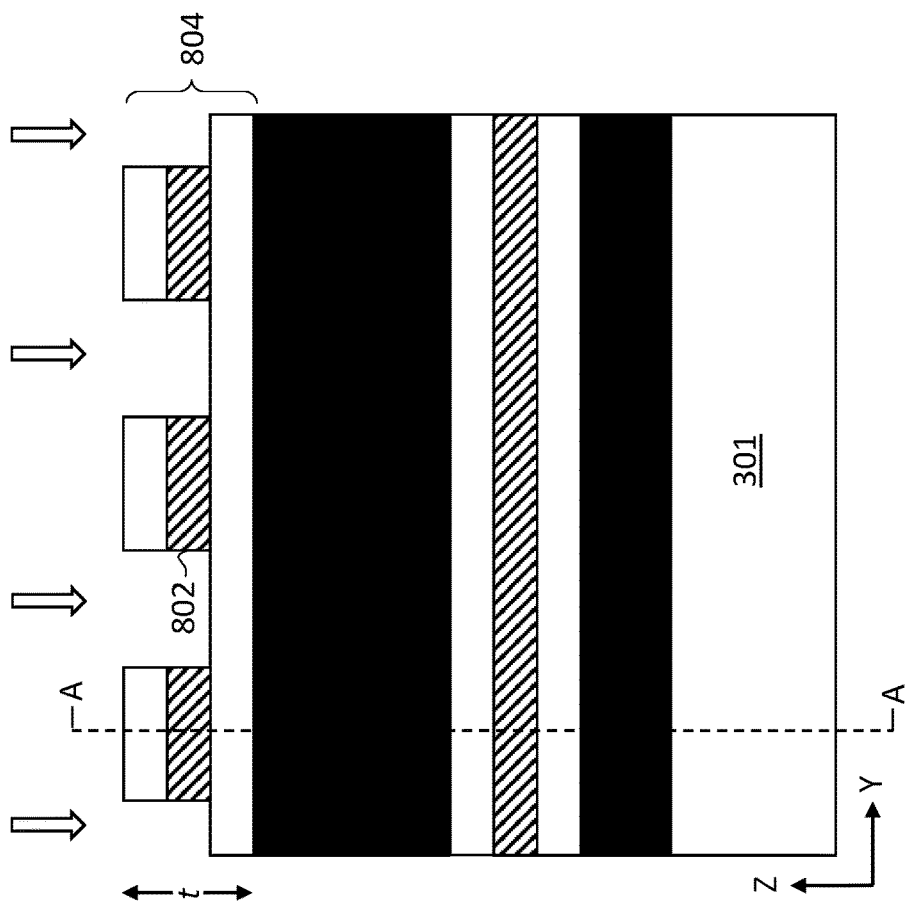
FIGS. 9A and 9B illustrate orthogonal cross-section views of another state of the memory device during the fabrication procedure, in accordance with some embodiments of the present disclosure.
Figure 9A:
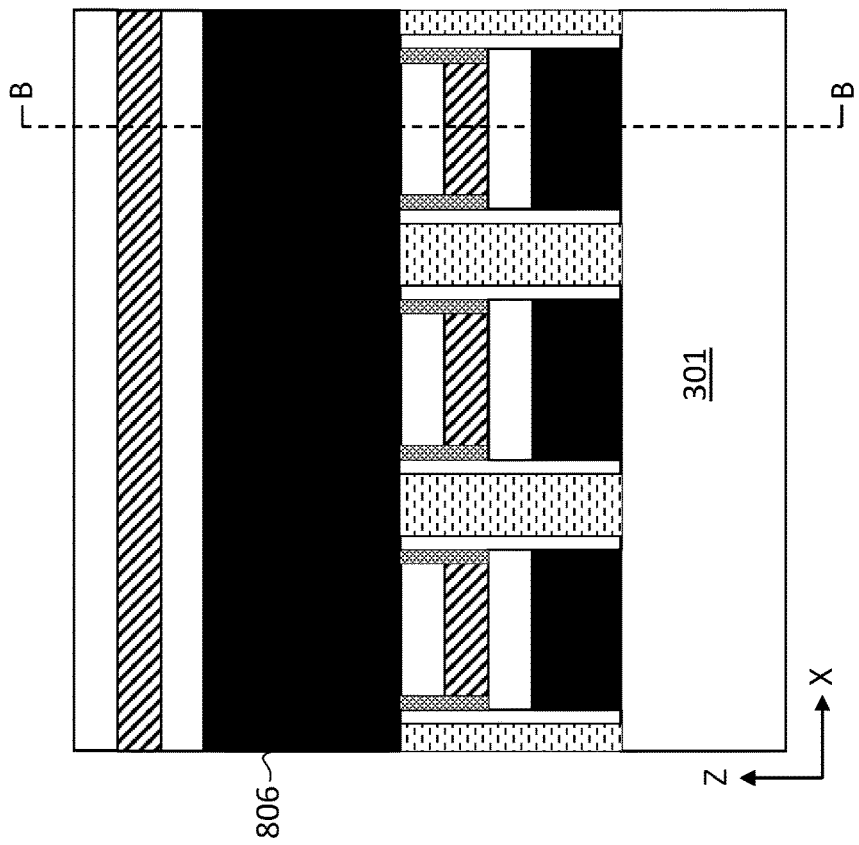

FIGS. 9A and 9B illustrate another etching process (generally denoted by the arrows) that etches through a portion of a total thickness t of stack of layers 804, according to some embodiments. The etch forms strips of some of the material layers of stack of layers 804, including memory bit layer 802, that run along the X-direction, according to some embodiments. As can be seen in this example case, the etching process etches through a thickness of memory bit layer 802, thus exposing the sidewalls of memory bit layer 802. However, the etch does not extend into any portion of second conductive layer 806, according to some embodiments. Lateral etching of the material layers is minimized due to the anisotropic nature of the etching process. According to an embodiment, the anisotropic etch is performed using standard dry etching techniques by placing substrate 301 into a vacuum chamber and introducing various gas chemistries and bias potentials to etch through the various material layers. Additionally, standard lithography techniques are performed to pattern a hard mask layer (not shown) to mask portions of the layers from the etch. Example hard mask layers include silicon oxide or silicon nitride.

Figure 10B:
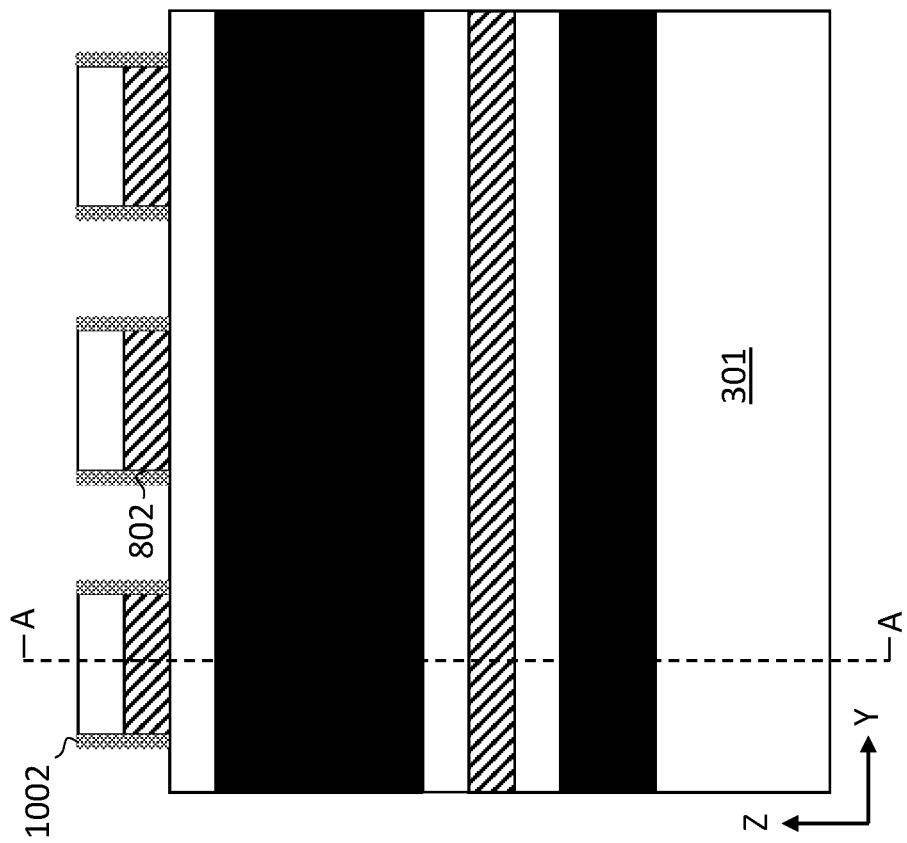
FIGS. 10A and 10B illustrate orthogonal cross-section views of another state of the memory device during the fabrication procedure, in accordance with some embodiments of the present disclosure.
Figure 10A:
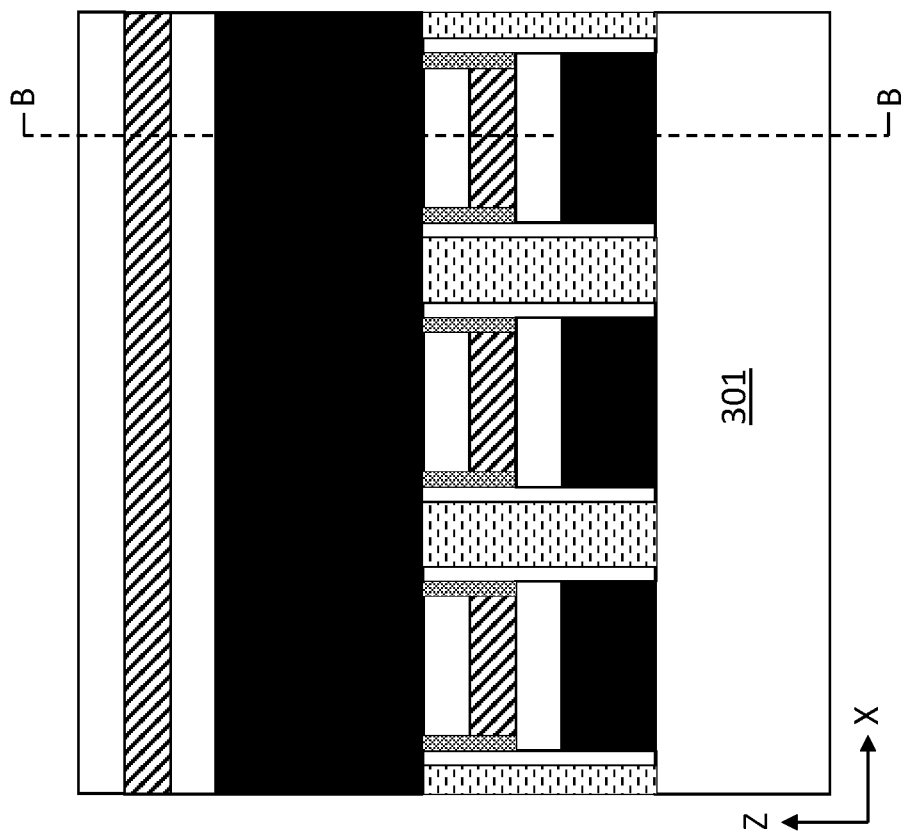

FIGS. 10A and 10B illustrate the deposition of a third dielectric layer 1002 over sidewalls of at least memory bit layer 802, according to some embodiments. Although not explicitly shown for clarity, the deposition of third dielectric layer 1002 blankets all regions of the device and an etching process would be performed to remove the planar portions of third dielectric layer 1002, thus leaving the sidewall portions of the deposited film. Third dielectric layer 1002 may include any of the same materials discussed above for first dielectric layer 502. Third dielectric layer 1002 may be deposited using a low temperature (e.g., less than 350° C.) ALD process. Third dielectric layer 1002 may be deposited at a thickness between about 20 Å and about 50 Å.

Figure 11B:
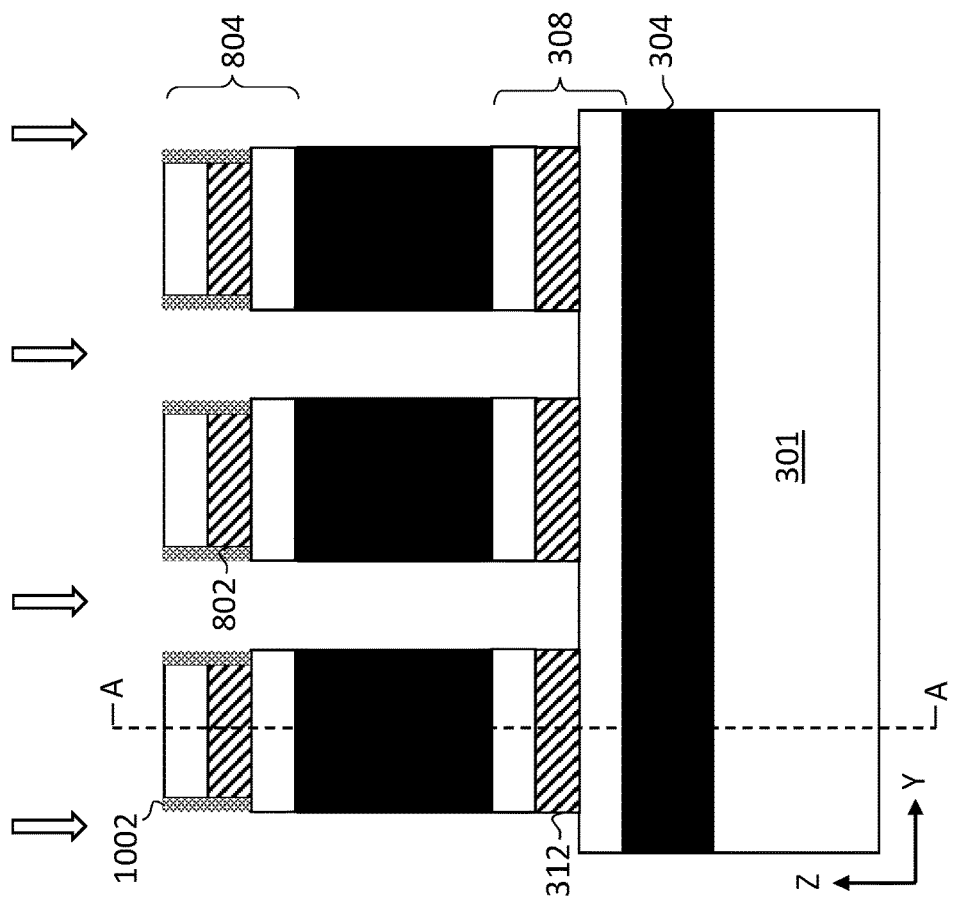
FIGS. 11A and 11B illustrate orthogonal cross-section views of another state of the memory device during the fabrication procedure, in accordance with some embodiments of the present disclosure.
Figure 11A:
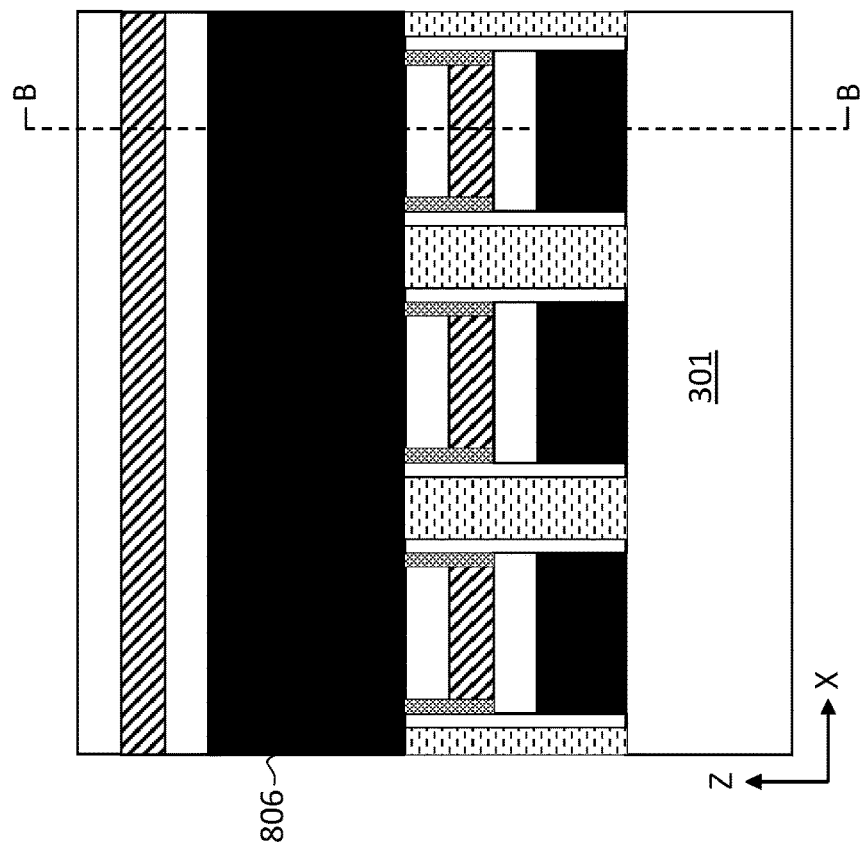

FIGS. 11A and 11B illustrate another etching process (generally denoted by the arrows) that etches through a remainder of the thickness of stack of layers 804 and through a thickness of second conductive layer 806, according to some embodiments. The etching process may be similar to the etching process illustrated in FIG. 6, according to some embodiments. During the etching process, memory bit layer 802 is protected by third dielectric layer 1002. Specifically, no part of exposed sidewalls of memory bit layer 802 are exposed during the time that second conductive layer 806 is being etched, according to some embodiments. The etching process patterns strips of second conductive layer 806 running in the X-direction, thus forming a plurality of either word lines or bit lines.

In some embodiments, the etch process continues further past second conductive layer 806 and etches through a portion of a thickness of stack of layers 308. Accordingly, the etch process of FIG. 11 begins to form the individual memory cells out of stack of layers 308. The etching process etches through a thickness of memory bit layer 312, thus exposing sidewalls of memory bit layer 312. However, the etch does not extend into any portion of first conductive layer 304, according to some embodiments.

FIGS. 12A and 12B illustrate the deposition of a fourth dielectric layer 1216 over third dielectric layer 1002, and also over the exposed sidewalls of at least memory bit layer 312, according to some embodiments. Fourth dielectric layer 1216 may include, for instance, any of the example materials discussed above for first dielectric layer 502. Fourth dielectric layer may be deposited at a thickness between about 20 Å and about 50 Å using any standard deposition technique, such as the same low temperature ALD process used to deposit first dielectric layer 502.

Figure 13B:
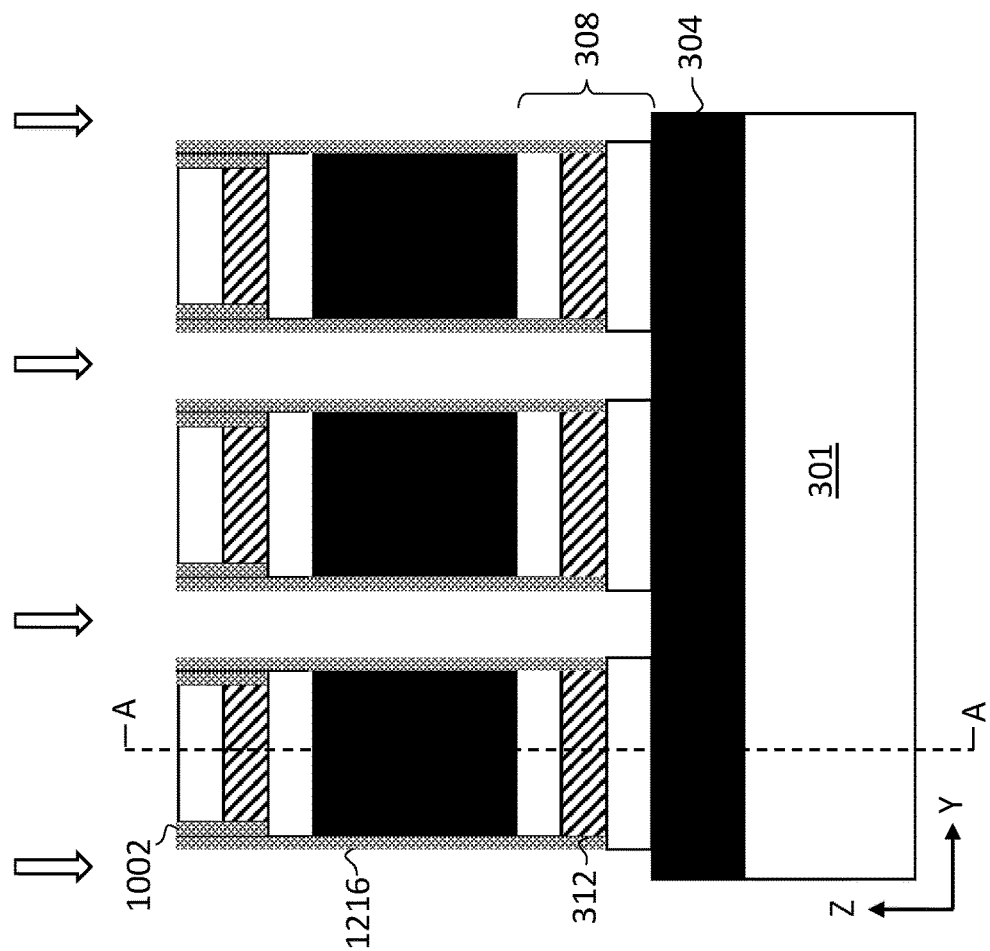
FIGS. 13A and 13B illustrate orthogonal cross-section views of another state of the memory device during the fabrication procedure, in accordance with some embodiments of the present disclosure.
Figure 13A:
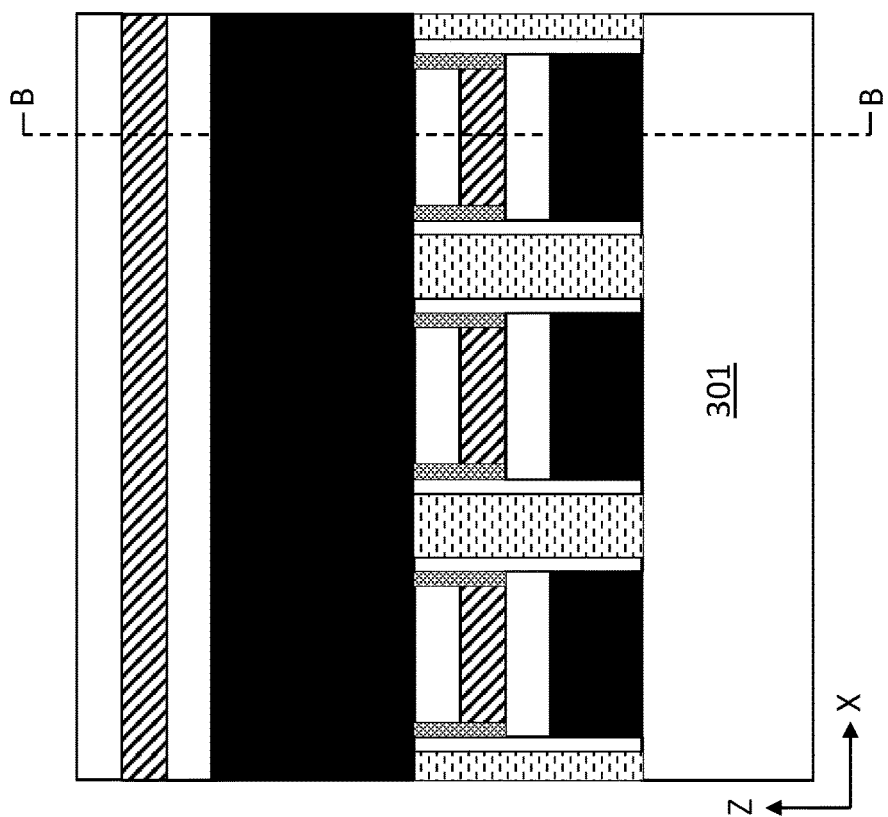

FIGS. 13A and 13B illustrate another etching process (generally denoted by the arrows) that etches through a remainder of the thickness of stack of layers 308 but does not etch into (or only minimally etches into) first conductive layer 304, according to some embodiments. The etching process may be similar to the etching process illustrated in FIG. 6, according to some embodiments. Memory bit layer 312 is protected by fourth dielectric layer 1216 in case any part of first conductive layer 304 is exposed during the etching process.

Figure 14B:
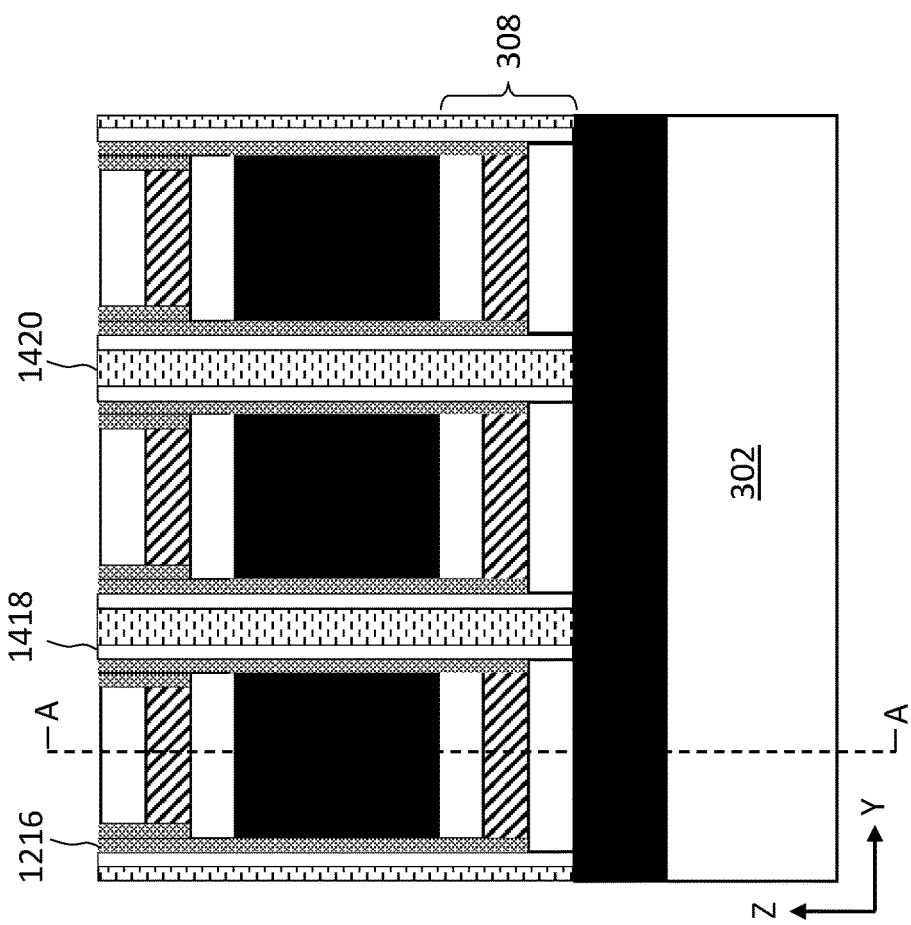
FIGS. 14A and 14B illustrate orthogonal cross-section views of another state of the memory device during the fabrication procedure, in accordance with some embodiments of the present disclosure.
Figure 14A:
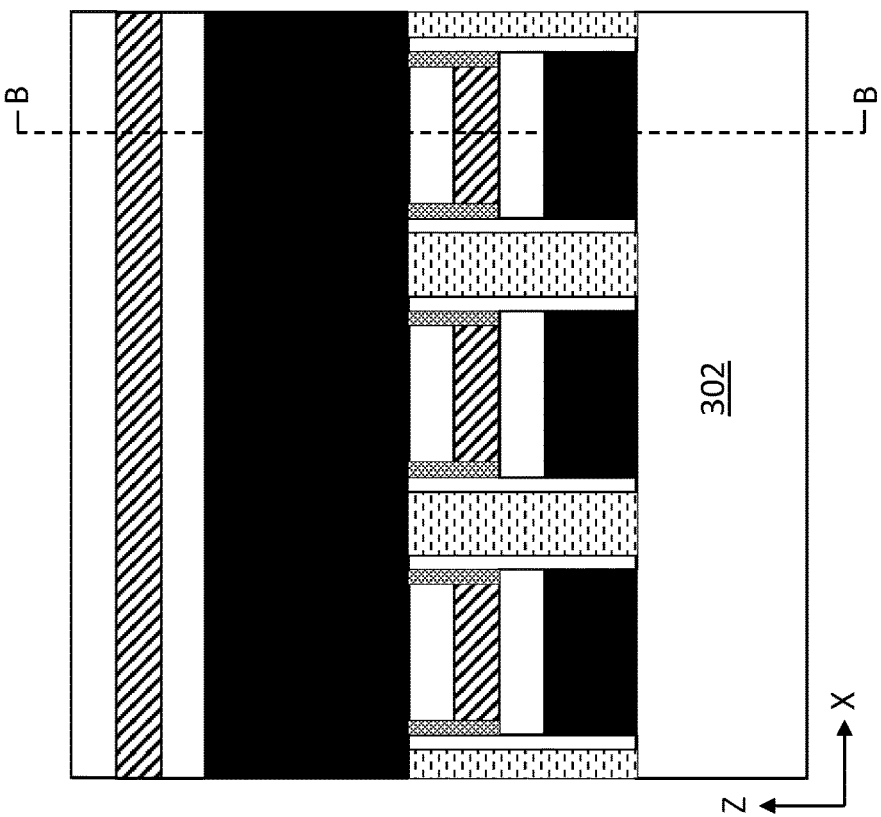

FIGS. 14A and 14B illustrate the deposition of additional material layers between adjacent layer stacks, according to some embodiments. According to some such embodiments, a fifth dielectric layer 1418 is deposited over fourth dielectric layer 1216, and a filling material 1420 is deposited to fill the remaining area between adjacent layer stacks. Fifth dielectric layer 1418 and filling material 1420 may be substantially similar to second dielectric layer 702 and filling material 704, respectively, as described above for FIG. 7.

According to some embodiments, a first tier of memory cells 102 are formed using the fabrication process illustrated in FIGS. 3-14. The fabrication process may be repeated any number of times to form additional tiers of memory cells 102 and form a three-dimensional memory device. During any etching process through a metal layer (such as conductive layers 304 and 806), one or more dielectric layers is present over sidewalls of one or more of the memory bit layers to protect the one or more of the memory bit layers during the etching process.

In some embodiments, fourth dielectric layer 1216 is not deposited and the etch performed in FIG. 13 is also not performed. In these examples, a bottom portion of layer stack 308 (e.g., conductive layer 310) remains attached across multiple memory cells running in the Y-direction.

Figure 15:
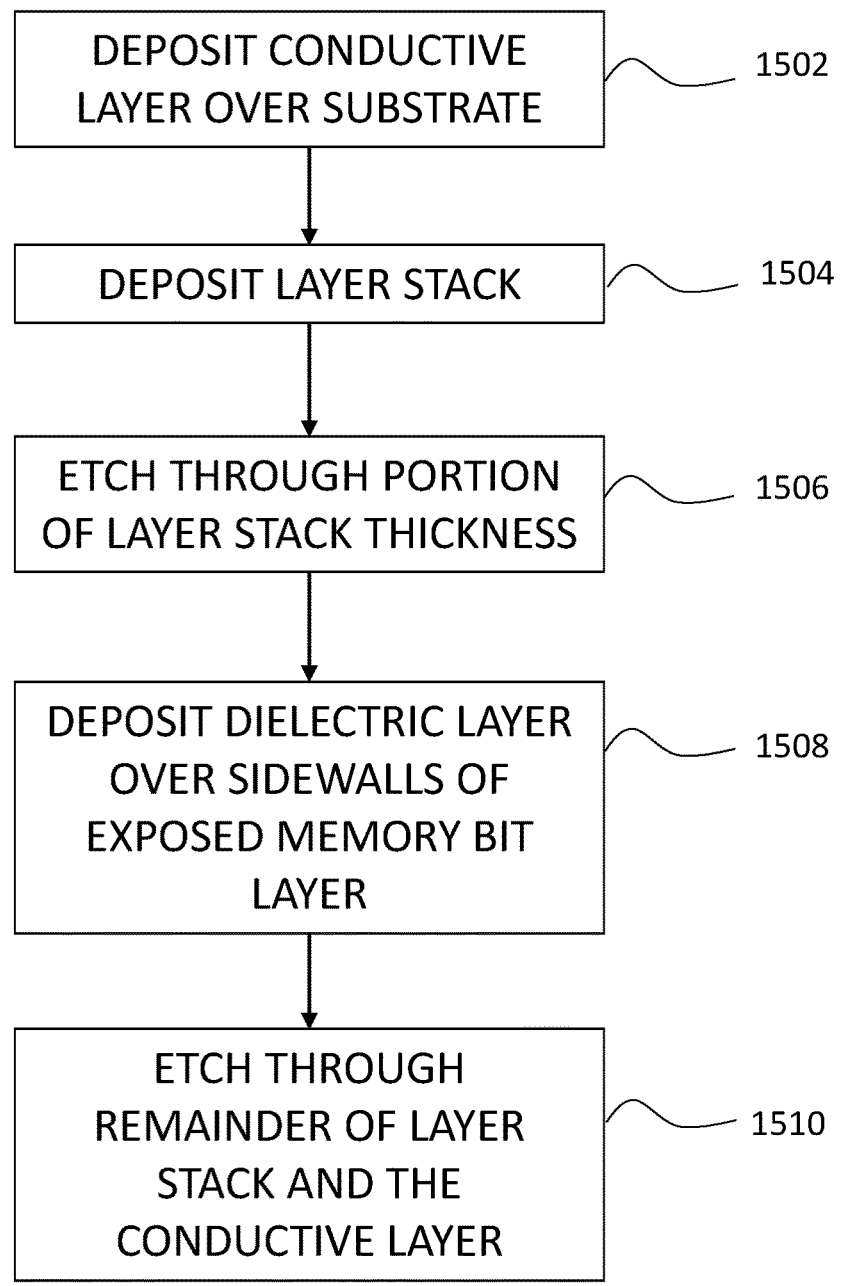
FIG. 15 is a flowchart of a fabrication process for a memory device, in accordance with an embodiment of the present disclosure.

FIG. 15 is a flow chart of a method 1500 for fabricating a memory device that includes an array of memory cells having memory bit material, according to an embodiment. Various operations of method 1500 may be illustrated in FIGS. 3-14. However, the correlation of the various operations of method 1500 to the specific components illustrated in FIGS. 3-14 is not intended to imply any structural and/or use limitations. Rather, FIGS. 3-14 provide one example embodiment of method 1500. Other operations may be performed before, during, or after any of the operations of method 1500.

Method 1500 begins at operation 1502 where a conductive layer is deposited over a substrate. The conductive layer may be, for example, a layer of tungsten and may be later patterned into a plurality of word lines or bit lines. Other suitable conductor materials can be used as well, as will be appreciated.

Method 1500 continues with operation 1504 where a layer stack is deposited over the conductive layer. The layer stack may include any number of layers that includes a plurality of conductive layers and at least one memory bit layer. The memory bit layer may be sandwiched by conductive layers in the layer stack. The conductive layers in the layer stack may be or otherwise include carbon. The memory bit layer may include, for example, chalcogenide or other example materials as variously provided herein.

Method 1500 continues with operation 1506 where an etching process is performed through only a portion of a thickness of the layer stack. According to some embodiments, a thickness of at least the memory bit layer is etched through such that sidewalls of the memory bit layer are exposed. By etching only through a portion of the layer stack, the etch does not expose the underlying conductive layer.

Method 1500 continues with operation 1508 where a dielectric layer is deposited over the exposed sidewalls of the memory bit layer. The dielectric layer may include silicon nitride due to its good adhesion properties to most other materials. In some other examples, the dielectric layer includes a high-k dielectric material. Examples of high-k materials include oxides of one or more of the following elements: Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi. The dielectric layer may be deposited using a low temperature ALD process. The dielectric layer may be deposited at a thickness between about 20 Å and about 50 Å. In some embodiments, a plurality of dielectric layers is deposited over the exposed sidewalls of the memory bit layer. The plurality of dielectric layers may have different thicknesses and material compositions.

Method 1500 continues with operation 1510 where a second etch is performed through a remainder of the layer stack and also through a thickness of the conductive layer. The second etching process may be similar to the first etching process of operation 1506. During the second etching process, the memory bit layer is protected by the dielectric layer deposited over its sidewalls. Specifically, no part of the memory bit layer is exposed during the time that the conductive layer is being etched, according to some embodiments. The etching process patterns strips of the conductive layer, thus forming a plurality of either word lines or bit lines.

According to some embodiments, the operations of method 1500 are generally repeated to form each tier of memory cells in a three-dimensional memory device.

Example Electronic Device

Figure 16:
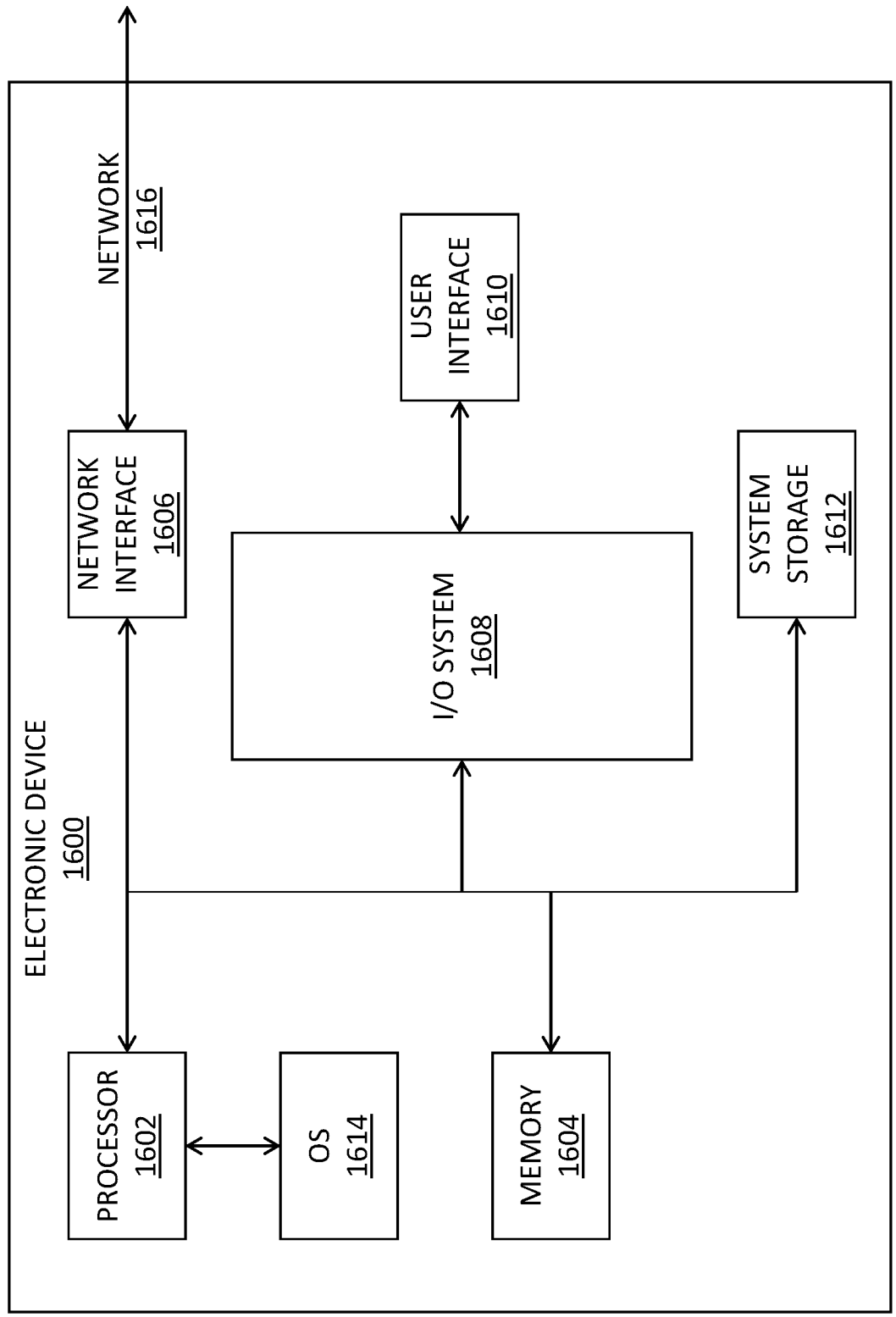
FIG. 16 illustrates an example electronic device that can include one or more of the embodiments of the present disclosure.

FIG. 16 illustrates an example electronic device 1600 that may include one or more memory devices such as the embodiments disclosed herein. In some embodiments, electronic device 1600 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, electronic device 1600 may comprise any combination of a processor 1602, a memory 1604, a network interface 1606, an input/output (I/O) system 1608, a user interface 1610, and a storage system 1612. As can be further seen, a bus and/or interconnect is also provided to allow for communication between the various components listed above and/or other components not shown. Electronic device 1600 can be coupled to a network 1616 through network interface 1606 to allow for communications with other computing devices, platforms, or resources. Other componentry and functionality not reflected in the block diagram of FIG. 16 will be apparent in light of this disclosure, and it will be appreciated that other embodiments are not limited to any particular hardware configuration.

Processor 1602 can be any suitable processor and may include one or more coprocessors or controllers to assist in control and processing operations associated with electronic device 1600. In some embodiments, processor 1602 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core.

Memory 1604 can be implemented using any suitable type of digital storage including, for example, flash memory and/or random access memory (RAM). In some embodiments, memory 1604 may include various layers of memory hierarchy and/or memory caches. Memory 1604 may be implemented as a volatile memory device such as, but not limited to, a RAM, dynamic RAM (DRAM), or static RAM (SRAM) device. Storage system 1612 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 1612 may comprise technology to increase the storage performance enhanced protection for valuable digital media when multiple hard drives are included. According to some embodiments of the present disclosure, either or both memory 1604 and storage system 1612 includes one or more memory arrays 122 having memory cells 102 fabricated using the processes discussed herein. According to some embodiments of the present disclosure, either or both memory 1604 and storage system 1612 may be incorporated in a chip package 200 and bonded to a printed circuit board (PCB) along with one or more other devices.

Processor 1602 may be configured to execute an Operating System (OS) 1614 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS).

Network interface 1606 can be any appropriate network chip or chipset which allows for wired and/or wireless connection between other components of electronic device 1600 and/or network 1616, thereby enabling electronic device 1600 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 1608 may be configured to interface between various I/O devices and other components of electronic device 1600. I/O devices may include, but not be limited to, a user interface 1610. User interface 1610 may include devices (not shown) such as a display element, touchpad, keyboard, mouse, and speaker, etc. I/O system 1608 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 1602 or any chipset of electronic device 1600.

It will be appreciated that in some embodiments, the various components of the electronic device 1600 may be combined or integrated in a system-on-a-chip (SoC) architecture. In some embodiments, the components may be hardware components, firmware components, software components or any suitable combination of hardware, firmware or software.

In various embodiments, electronic device 1600 may be implemented as a wireless system, a wired system, or a combination of both. When implemented as a wireless system, electronic device 1600 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, electronic device 1600 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

Example 1 is a memory device that includes a plurality of conductive bit lines, a plurality of conductive word lines, and a set of memory cells included in a memory cell array. Each of the memory cells is located between a corresponding bit line of the plurality of conductive bit lines and a corresponding word line of the plurality of conductive word lines. Each of the memory cells includes a stack of layers with a memory bit layer, and a dielectric layer on one or more sidewalls of only a portion of a total thickness of the stack of layers, such that the dielectric layer is on one or more sidewalls of the memory bit layer.

Example 2 includes the subject matter of Example 1, wherein the memory cell array is arranged in three dimensions with memory cells positioned in rows and columns along a plurality of XY planes stacked in a Z direction.

Example 3 includes the subject matter of Example 2, wherein one or more of the memory cells has a dimension along an X-direction that is greater than a dimension along a Y-direction.

Example 4 includes the subject matter of any one of Examples 1-3, wherein the stack of layers consists only of a first conductive layer, the memory bit layer on the first conductive layer, and a second conductive layer on the memory bit layer, and wherein only the stack of layers exists between the corresponding bit line of the plurality of conductive bit lines and the corresponding word line of the plurality of conductive word lines.

Example 5 includes the subject matter of Example 4, wherein the dielectric layer is on one or more sidewalls of the second conductive layer, and the dielectric layer is on a top surface of the first dielectric layer.

Example 6 includes the subject matter of any one of Examples 1-5, wherein the plurality of conductive bit lines run orthogonal to the plurality of conductive word lines.

Example 7 includes the subject matter of any one of Examples 1-6, wherein one or more of the memory cells has a height between about 60 nm and about 80 nm.

Example 8 includes the subject matter of any one of Examples 1-7, wherein the dielectric layer comprises a high-k material.

Example 9 includes the subject matter of any one of Examples 1-8, wherein the dielectric layer is a first dielectric layer, the device further comprising a second dielectric layer over the first dielectric layer, wherein the second dielectric layer is over one or more sidewalls of the total thickness of the stack of layers, such that the first dielectric layer is not present between the second dielectric layer and the stack of layers in at least one location.

Example 10 includes the subject matter of any one of Examples 1-9, wherein the memory bit layer comprises chalcogenide.

Example 11 includes the subject matter of any one of Examples 1-10, wherein the plurality of conductive bit lines and the plurality of conductive word lines comprise one or both of tungsten and carbon.

Example 12 is an integrated circuit comprising the memory device of any one of claims 1-11.

Example 13 is a printed circuit board comprising the integrated circuit of Example 12.

Example 14 is a memory chip comprising the memory device of any one of claims 1-11.

Example 15 is an electronic device that includes a chip package comprising one or more dies, where one or more of the dies includes a stack of layers between a word line and a bit line, the stack of layers comprising a memory bit layer, and a dielectric layer on one or more sidewalls of only a portion of a total thickness of the stack of layers, such that the dielectric layer is on one or more sidewalls of the memory bit layer.

Example 16 includes the subject matter of Example 15, wherein the bit line runs orthogonal to the word line.

Example 17 includes the subject matter of Example 15 or 16, wherein the dielectric layer comprises a high-k material.

Example 18 includes the subject matter of any one of Examples 15-17, wherein the dielectric layer is a first dielectric layer, the device further comprising a second dielectric layer over the first dielectric layer, wherein the second dielectric layer is over one or more sidewalls of the total thickness of the stack of layers, such that the first dielectric layer is not present between the second dielectric layer and the stack of layers in at least one location.

Example 19 includes the subject matter of any one of Examples 15-18, wherein the memory bit layer comprises chalcogenide.

Example 20 includes the subject matter of any one of Examples 15-19, wherein the stack of layers consists only of a first conductive layer, the memory bit layer on the first conductive layer, and a second conductive layer on the memory bit layer, and wherein only the stack of layers exists between the word line and the bit line.

Example 21 is a method of fabricating a memory device. The method includes depositing a conductive layer over a substrate; depositing a stack of layers over the conductive layer, the stack of layers including a memory bit layer; etching through only a portion of a total thickness of the stack of layers such that an entire thickness of the memory bit layer is etched through; depositing a dielectric layer over one or more sidewalls of at least the memory bit layer; and etching through a remaining portion of the stack of layers and through a thickness of the conductive layer.

Example 22 includes the subject matter of Example 21, wherein the dielectric layer comprises a high-k material.

Example 23 includes the subject matter of Example 21 or 22, wherein depositing the dielectric layer comprises depositing the first dielectric layer to a thickness between 20 Å and 50 Å.

Example 24 includes the subject matter of any one of Examples 21-23, further comprising depositing a second dielectric layer over the first dielectric layer.

Example 25 includes the subject matter of Example 24, wherein depositing the second dielectric layer comprises depositing silicon nitride.

Example 26 includes the subject matter of any one of Examples 21-25, wherein depositing the first dielectric layer comprises depositing the first dielectric layer using atomic layer deposition (ALD).

Example 27 includes the subject matter of any one of Examples 21-26, wherein the stack of layers is a first stack of layers, the conductive layer is a first conductive layer, and the memory bit layer is a first memory bit layer, the method further comprising depositing a second conductive layer over the first stack of layers and a second stack of layers over the second conductive layer, the second stack of layers including a second memory bit layer.

Example 28 includes the subject matter of Example 27, further comprising etching through only a portion of a total thickness of the second stack of layers such that an entire thickness of the second memory bit layer is etched through; depositing a second dielectric layer over one or more sidewalls of at least the second memory bit layer; and etching through a remaining portion of the second stack of layers, through a thickness of the conductive layer, and through a thickness of the first stack of layers.

Example 29 includes the subject matter of Example 28, further comprising depositing a third dielectric layer over one or more sidewalls of at least the second memory bit layer.

Example 30 includes the subject matter of any one of Examples 21-29, wherein the memory bit layer comprises chalcogenide.

Example 31 includes the subject matter of any one of Examples 21-30, wherein depositing a conductive layer comprises depositing one or both of tungsten and carbon.

What is claimed is:

1. A memory device, comprising:
a plurality of conductive bit lines;
a plurality of conductive word lines; and
a set of memory cells included in a memory cell array, each of the memory cells located between a corresponding bit line of the plurality of conductive bit lines and a corresponding word line of the plurality of conductive word lines, each of the memory cells comprising
a stack of layers comprising a memory bit layer, and
a first dielectric layer on one or more sidewalls of only a portion of a total thickness of the stack of layers, such that the first dielectric layer is on one or more sidewalls of the memory bit layer, and
a second dielectric layer over the first dielectric layer, wherein the second dielectric layer is over one or more sidewalls of the total thickness of the stack of layers, such that the first dielectric layer is not present between the second dielectric layer and the stack of layers in at least one direction.

2. The memory device of claim 1, wherein the memory cell array is arranged in three dimensions with memory cells positioned in rows and columns along a plurality of XY planes stacked in a Z direction.

3. The memory device of claim 2, wherein one or more of the memory cells has a dimension along an X-direction that is greater than a dimension along a Y-direction.

4. The memory device of claim 1, wherein the stack of layers consists only of a first conductive layer, the memory bit layer on the first conductive layer, and a second conductive layer on the memory bit layer, and wherein only the stack of layers exists between the corresponding bit line of the plurality of conductive bit lines and the corresponding word line of the plurality of conductive word lines.

5. The memory device of claim 1, wherein the plurality of conductive bit lines run orthogonal to the plurality of conductive word lines.

6. The memory device of claim 1, wherein one or more of the memory cells has a height between about 60 nm and about 80 nm.

7. The memory device of claim 1, wherein the first dielectric layer and the second dielectric layer comprises a high-k material.

8. The memory device of claim 1, wherein the memory bit layer comprises chalcogenide.

9. The memory device of claim 1, wherein the plurality of conductive bit lines and the plurality of conductive word lines comprise one or both of tungsten and carbon.

10. An integrated circuit comprising the memory device of claim 1.

11. A printed circuit board comprising the integrated circuit of claim 10.

12. A memory chip comprising the memory device of claim 1.

13. An electronic device, comprising:
a chip package comprising one or more dies, at least one of the one or more dies comprising
a stack of layers between a word line and a bit line, the stack of layers comprising a memory bit layer, and
a first dielectric layer on one or more sidewalls of only a portion of a total thickness of the stack of layers, such that the first dielectric layer is on one or more sidewalls of the memory bit layer, and
a second dielectric layer over the first dielectric layer, wherein the second dielectric layer is over one or more sidewalls of the total thickness of the stack of layers, such that the first dielectric layer is not present between the second dielectric layer and the stack of layers in at least one direction.

14. The electronic device of claim 13, wherein the first dielectric layer and the second dielectric layer comprise a high-k material.

15. The electronic device of claim 13, wherein the memory bit layer comprises chalcogenide.

16. The electronic device of claim 13, wherein the stack of layers consists only of a first conductive layer, the memory bit layer on the first conductive layer, and a second conductive layer on the memory bit layer, and wherein only the stack of layers exists between the word line and the bit line.

* * * * *